(12) United States Patent
Tai et al.

(10) Patent No.: US 10,964,882 B2
(45) Date of Patent: Mar. 30, 2021

(54) BONDING METHOD

(71) Applicant: NGK INSULATORS, LTD., Nagoya (JP)

(72) Inventors: Tomoyoshi Tai, Inazawa (JP); Yuji Hori, Owariasahi (JP); Keiichiro Asai, Nagoya (JP); Takashi Yoshino, Ama (JP); Masashi Goto, Nagoya (JP); Masahiko Namerikawa, Seto (JP)

(73) Assignee: NGK INSULATORS, LTD.

( * ) Notice: Subject to any disclaimer, the term of this patent is extended or adjusted under 35 U.S.C. 154(b) by 0 days.

(21) Appl. No.: 16/135,689

(22) Filed: Sep. 19, 2018

(65) Prior Publication Data

US 2019/0036009 A1    Jan. 31, 2019

Related U.S. Application Data

(63) Continuation of application No. PCT/JP2017/006461, filed on Feb. 22, 2017.

(30) Foreign Application Priority Data

Mar. 25, 2016 (JP) .............................. JP2016-061710

(51) Int. Cl.
*H01L 41/313* (2013.01)
*H01L 41/187* (2006.01)
(Continued)

(52) U.S. Cl.
CPC ........ *H01L 41/313* (2013.01); *H01L 41/1871* (2013.01); *H01L 41/1873* (2013.01);
(Continued)

(58) Field of Classification Search
CPC ............. H01L 41/1871; H01L 41/1873; H01L 41/313; H01L 41/337; H01L 41/39;
(Continued)

(56) References Cited

U.S. PATENT DOCUMENTS 7,213,314 B2    5/2007   Abbott et al.
7,331,092 B2    2/2008   Miura et al.
(Continued)

FOREIGN PATENT DOCUMENTS

JP          3774782 B2    5/2006
JP        2010-187373 A   8/2010
(Continued)

OTHER PUBLICATIONS

Machine Translation (English) of Japanese Publication JP 2012-85286, Nov. 2019. (Year: 2019).*
(Continued)

*Primary Examiner* — A. Dexter Tugbang
(74) *Attorney, Agent, or Firm* — Flynn Thiel, P.C.

(57) ABSTRACT

A bonding layer 3 is formed over a piezoelectric material substrate, and the bonding layer is made of one or more materials selected from the group consisting of silicon nitride, aluminum nitride, alumina, tantalum pentoxide, mullite, niobium pentoxide and titanium oxide. A neutralized beam is irradiated onto a surface of the bonding layer and a surface of a supporting body to activate the surface of the bonding layer and the surface of the supporting body. The surface of the bonding layer and the surface of the supporting body are bonded by direct bonding.

6 Claims, 13 Drawing Sheets

(51) Int. Cl.
*H03H 3/08* (2006.01)
*H01L 41/39* (2013.01)
*H01L 41/337* (2013.01)
*H03H 9/25* (2006.01)
*H03H 9/02* (2006.01)
*H03H 9/05* (2006.01)
*H03H 9/145* (2006.01)
*H03H 9/17* (2006.01)
*H01L 23/00* (2006.01)
*C08J 5/18* (2006.01)
*H01L 51/56* (2006.01)
*C09J 7/35* (2018.01)

(52) U.S. Cl.
CPC ............ *H01L 41/337* (2013.01); *H01L 41/39* (2013.01); *H03H 3/08* (2013.01); *H03H 9/02559* (2013.01); *H03H 9/0585* (2013.01); *H03H 9/145* (2013.01); *H03H 9/17* (2013.01); *H03H 9/25* (2013.01); *C08J 5/18* (2013.01); *C09J 7/35* (2018.01); *H01L 24/32* (2013.01); *H01L 51/56* (2013.01); *Y10T 29/42* (2015.01)

(58) Field of Classification Search
CPC ........... H01L 51/56; H01L 24/32; H03H 3/08; H03H 9/02559; H03H 9/0585; H03H 9/145; H03H 9/17; H03H 9/25; C08J 5/18; C09J 7/35; Y10T 29/42; C08G 18/0823

See application file for complete search history.

(56) References Cited

U.S. PATENT DOCUMENTS

| | | | |
|---|---|---|---|
| 7,736,993 B2 | 6/2010 | Allibert et al. | |
| 7,977,747 B2 | 7/2011 | Allibert et al. | |
| 8,113,468 B2* | 2/2012 | Patel | B64G 1/283 244/165 |
| 8,264,303 B2 | 9/2012 | Suzuki | |
| 8,729,771 B2 | 5/2014 | Kobayashi et al. | |
| 8,866,365 B2 | 10/2014 | Hori et al. | |
| 9,680,083 B2 | 6/2017 | Hori et al. | |
| 2003/0067369 A1* | 4/2003 | Nakano | H03H 3/08 333/193 |
| 2007/0139899 A1* | 6/2007 | Van Schuylenbergh | H01L 24/32 361/760 |
| 2008/0102262 A1* | 5/2008 | Esaki | C08G 18/0823 428/220 |
| 2009/0198013 A1* | 8/2009 | Shin | C09J 7/35 524/611 |
| 2012/0126669 A1* | 5/2012 | Kobayashi | Y10T 29/42 310/367 |
| 2012/0198672 A1* | 8/2012 | Ueda | Y10T 29/42 29/25.35 |
| 2014/0015000 A1* | 1/2014 | Nishiyama | C08J 5/18 257/100 |
| 2015/0008789 A1 | 1/2015 | Iwamoto | |
| 2015/0171365 A1* | 6/2015 | Suga | H01L 51/56 257/787 |
| 2015/0365067 A1 | 12/2015 | Hori et al. | |
| 2016/0049469 A1 | 2/2016 | Yoshikawa et al. | |
| 2019/0036008 A1* | 1/2019 | Tai | H01L 41/313 |

FOREIGN PATENT DOCUMENTS

| | | | | |
|---|---|---|---|---|
| JP | 2012085286 A | * | 4/2012 | ......... H03H 9/02574 |
| JP | 3184763 U | | 7/2013 | |
| JP | 2014-086400 A | | 5/2014 | |
| JP | 2015/145054 A | | 8/2015 | |
| JP | 5814727 B2 | | 11/2015 | |
| KR | 1020070077438 A | | 7/2007 | |
| KR | 1020120035900 A | | 4/2012 | |
| KR | 1020150115020 A | | 10/2015 | |
| WO | WO 2011/158636 A1 | | 12/2011 | |
| WO | WO 2013/146374 A1 | | 10/2013 | |
| WO | WO 2014/010696 A1 | | 1/2014 | |
| WO | WO 2014/027538 A1 | | 2/2014 | |
| WO | WO 2014/192597 A1 | | 12/2014 | |

OTHER PUBLICATIONS

International Preliminary Report on Patentability for PCT/JP2017/006461, dated Sep. 25, 2018 (1 pg.).
English translation of Written Opinion of the International Searching Authority for PCT/JP2017/006461, dated Apr. 4, 2017 (6 pgs.).
Office Action of Korean Patent Office issued in Korean Application No. 1020187025132 dated Feb. 27, 2019 (15 pages).
English language International Search Report for corresponding PCT/JP2017/006461 (2 pgs.).

* cited by examiner

US 10,964,882 B2

BONDING METHOD

CROSS-REFERENCE TO RELATED APPLICATIONS

This is a continuation of International Application No. PCT/JP2017/006461, filed Feb. 22, 2017, which claims the priority of Japanese Patent Application No. 2016-061710, filed Mar. 25, 2016, the entire contents of which are incorporated herein by reference.

TECHNICAL FIELD

The present invention relates to a method of bonding a piezoelectric material substrate and a supporting body composed of a single crystal.

BACKGROUND ARTS

A surface acoustic wave device is known which functions as a filter device or oscillator used in mobile phones or the like and an acoustic wave device such as a lamb wave device or film bulk acoustic resonator (FBAR) using a piezoelectric thin film. As such an acoustic wave device, a device produced by adhering a supporting body and a piezoelectric substrate propagating a surface acoustic wave and by providing interdigitated electrodes capable of oscillating the surface acoustic wave on a surface of the piezoelectric substrate is known. By adhering the supporting body whose thermal expansion coefficient is lower than that of the piezoelectric substrate onto the piezoelectric substrate, the change of size of the piezoelectric substrate responsive to a temperature change is reduced so that the change of the frequency characteristics as the surface acoustic wave device is reduced.

For example, it is proposed, in patent document 1, a surface acoustic wave device having a structure produced by adhering a piezoelectric substrate and silicon substrate with an adhesive layer composed of an epoxy adhering agent.

Here, it is known that, in bonding a piezoelectric substrate and silicon substrate, a silicon oxide film is formed on a surface of the piezoelectric substrate, and a silicon substrate and the piezoelectric substrate are bonded through the silicon oxide film (patent document 2). In the bonding step, a plasma beam is irradiated onto the surfaces of the silicon oxide film and silicon substrate to activate the surfaces, followed by the direct bonding (plasma activation method).

Further, it is known that a surface of the piezoelectric substrate is made a roughened surface, a filler layer is provided on the roughened surface to provide a flattened surface, and the filler layer is adhered onto a silicon substrate through an adhering layer (patent document 3). According to this method, an epoxy-based or acryl-based resin is used for the filler layer and adhering layer, and the bonding surface of the piezoelectric substrate is made the roughened surface to reduce the reflection of bulk waves and to reduce spurious waves. Further, as the adhesion is performed after the roughened surface is filled and flattened, air bubbles are hardly included in the adhering layer.

PRIOR ART DOCUMENTS

Patent Documents (Patent document 1) Japanese Patent publication No. 2010-187373A
(Patent document 2) U.S. Pat. No. 7,213,314 B2
(Patent document 3) Japanese Patent No. 5814727 B
(Patent document 4) Japanese Patent publication No. 2014-086400A

SUMMARY OF THE INVENTION

Object to be Solved by Invention

In the case that a silicon substrate is directly bonded to a piezoelectric substrate, a plasma activation method is generally used. However, according to the plasma activation method, heating is necessary for improving the strength after the bonding, and if the bonding temperature is low, the bonding strength tends to be lowered. However, as the bonding temperature is made high, cracks tend to occur due to a difference between the silicon substrate and piezoelectric substrate.

On the other hand, a direct bonding method of a so-called FAB (Fast Atom Beam) system (patent document 4) is known. According to this method, a neutralized atomic beam is irradiated onto the respective bonding surfaces at an ambient temperature and direct bonding is performed.

However, according to this method, the bonding strength of the silicon substrate and piezoelectric substrate is low, so that separation may occur during the subsequent processing steps after the bonding.

An object of the present invention is, in directly bonding a piezoelectric material substrate and a supporting body composed of a single crystal, to enable the bonding at an ambient temperature and to improve the bonding strength.

Means for Solving Object

The first invention provides a method of bonding a piezoelectric material substrate and a supporting body comprising a single crystal, the method comprising the steps of:
forming a bonding layer over the piezoelectric material substrate, said bonding layer comprising one or more materials selected from the group consisting of silicon nitride, aluminum nitride, alumina, tantalum pentoxide, mullite, niobium pentoxide and titanium oxide;
irradiating a neutralized beam onto a surface of the bonding layer and a surface of the supporting body to activate the surface of the bonding layer and the surface of the supporting body; and
bonding the surface of the bonding layer and the surface of the supporting body by direct bonding.

The second invention provides a method of bonding a piezoelectric material substrate comprising a piezoelectric single crystal and a supporting body comprising a single crystal, the method comprising the steps of:
forming a bonding layer over said supporting body, the bonding layer comprising one or more materials selected from the group consisting of silicon nitride, aluminum nitride, alumina, tantalum pentoxide, mullite, niobium pentoxide and titanium oxide;
irradiating a neutralized beam onto a surface of the bonding layer and a surface of the piezoelectric material substrate to activate the surface of the bonding layer and the surface of the piezoelectric material substrate; and
bonding the surface of said bonding layer and the surface of the piezoelectric material substrate by direct bonding.

The third invention provides a method of bonding a piezoelectric material substrate and a supporting body comprising a single crystal, said method comprising the steps of:
forming a first bonding layer over the piezoelectric material substrate, the first bonding layer comprising one or more materials selected from the group consisting of silicon nitride, aluminum nitride, alumina, tantalum pentoxide, mullite, niobium pentoxide and titanium oxide;

forming a second bonding layer over the supporting body, said second bonding layer comprising one or more materials selected from the group consisting of silicon nitride, aluminum nitride, alumina, tantalum pentoxide, mullite, niobium pentoxide and titanium oxide;

irradiating a neutralized beam onto each of a surface of the first bonding layer and a surface of the second bonding layer to activate the surface of the first bonding layer and the surface of the second bonding layer; and bonding the surface of the first bonding layer and the surface of the second bonding layer by direct bonding.

According to the present invention, when a piezoelectric material substrate and a supporting body composed of a single crystal are directly bonded, bonding at an ambient temperature can be realized and the bonding strength can be improved.

MODES FOR CARRYING OUT THE INVENTION

Figure 1A:
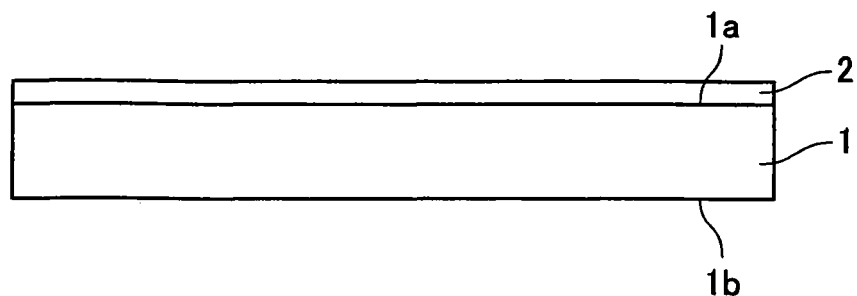
FIG. 1(a) shows the state that a silicon oxide film 2 is provided on a piezoelectric material substrate 1.

The present invention will be described in detail below, appropriately referring to the drawings.

FIGS. 1 to 5 relate to the first invention. Further, FIGS. 1 and 2 relate to an embodiment of providing a silicon oxide film on a piezoelectric material substrate.

Figure 1B:
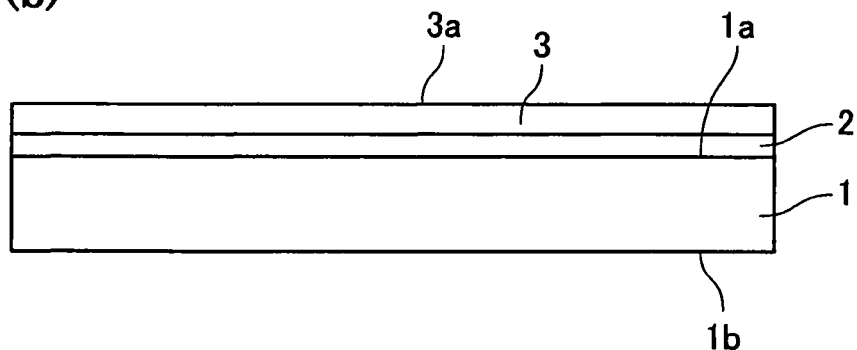
FIG. 1(b) shows the state that a bonding layer 3 is provided on the silicon oxide film 2.
Figure 1C:
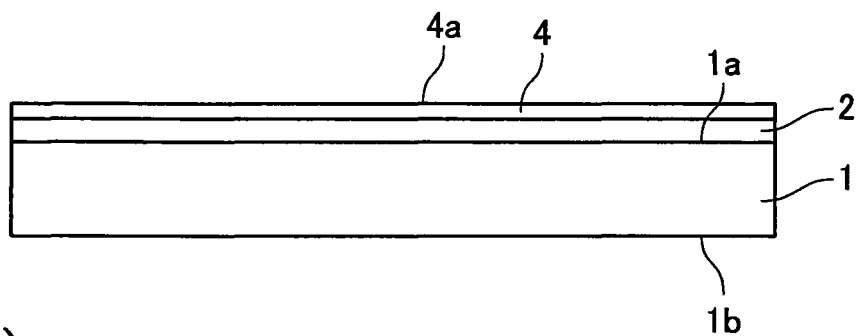
FIG. 1(c) shows the state that a surface 4a of a bonding layer 4 is subjected to a flattening process.

As shown in FIG. 1(a), a silicon oxide film 2 is provided on a surface 1a of a piezoelectric material substrate 1. 1b represents a surface on the opposite side. Then, as shown in FIG. 1(b), a bonding layer 3 is provided on the silicon oxide film 2. At this time, an unevenness may be present on a surface of the bonding layer 3.

Figure 1D:
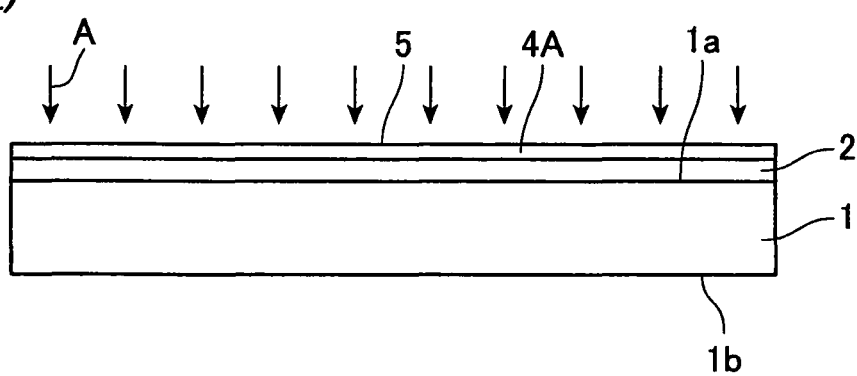
FIG. 1(d) shows the state that a flat surface 4a is activated by neutralized beam A.

Then, according to a preferred embodiment, the surface 3a of the bonding layer 3 is subjected to a flattening process to form a flat surface 4a. By this flattening process, a thickness of the bonding layer 3 is usually lowered to a thinner bonding layer 4 (refer to FIG. 1(c)). Then, a neutralized beam is irradiated onto the flat surface 4a as an arrow A, as shown in FIG. 1(d), to activate the surface of the bonding layer 4A to obtain an activated surface 5.

Figure 2A:
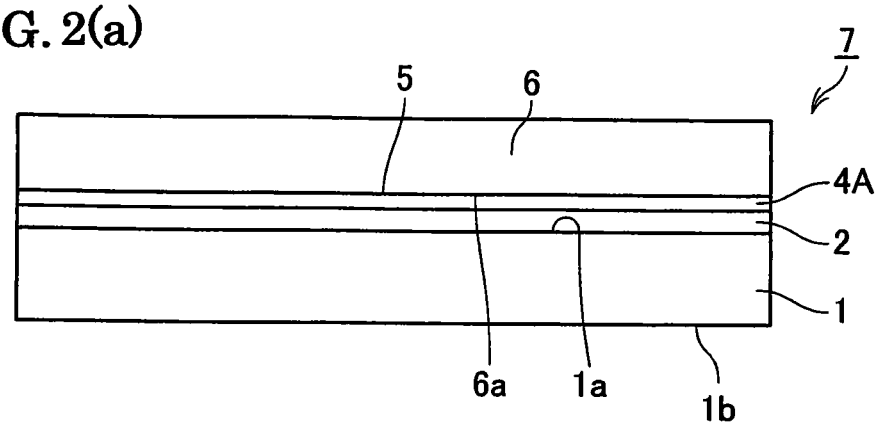
FIG. 2(a) shows the state that the piezoelectric material substrate 1 and supporting body 6 are bonded.

On the other hand, as shown in FIG. 2(a), a neutralized beam is irradiated onto a surface of a supporting body 6 to activate it to provide an activated surface 6a. Then, the activated surface 6a of the supporting body 6 and the activated surface 5 of the bonding layer 4A are bonded by direct bonding to obtain a bonded body 7.

Figure 2B:
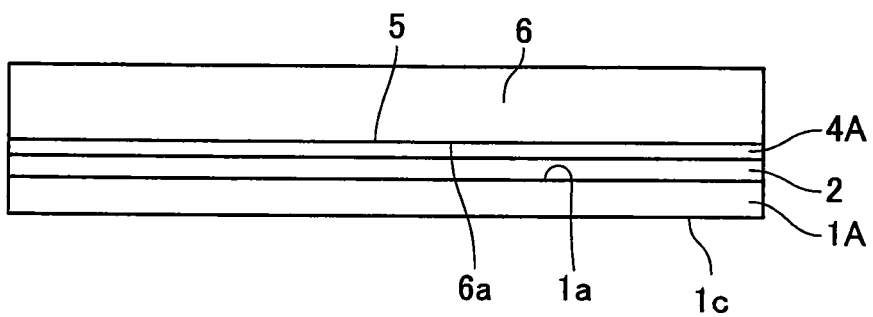
FIG. 2(b) shows the state that the piezoelectric material substrate 1 is thinned by processing.

According to a preferred embodiment, the surface 1b of the piezoelectric single crystal substrate of the bonded body 7 is further subjected to polishing, so that the thickness of the piezoelectric single crystal substrate 1A is made smaller as shown in FIG. 2(b). Numeral 1c represents a polished surface.

Figure 2C:
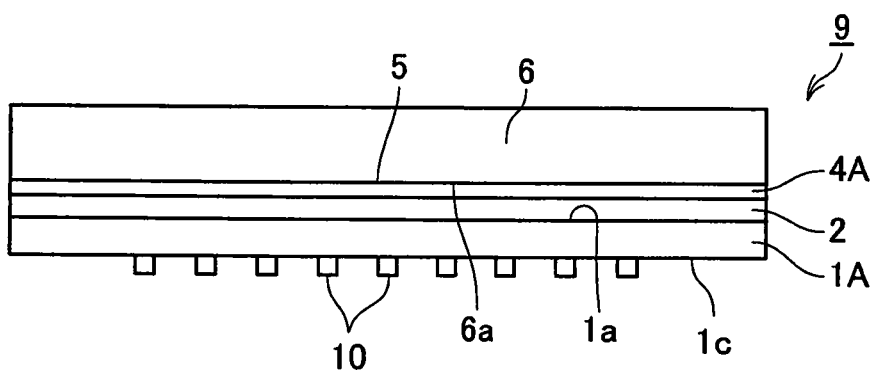
FIG. 2(c) shows the state that electrodes 10 are provided on a piezoelectric material substrate 1A.

According to FIG. 2(c), predetermined electrodes 10 are formed on a polished surface 1c of the piezoelectric single crystal substrate 1A to produce an acoustic wave device 9.

FIGS. 3 and 4 relate to an embodiment in which a surface of a piezoelectric single crystal substrate is made a roughened surface.

Figure 3A:
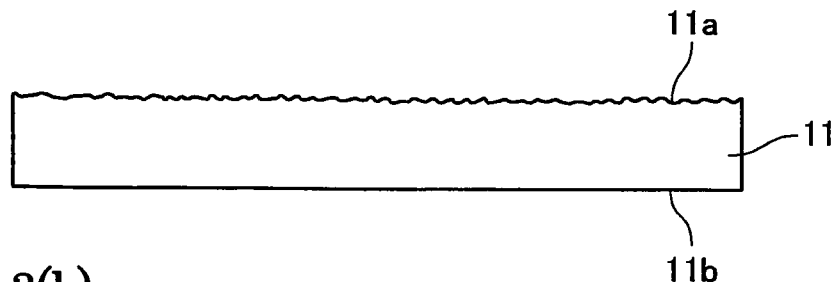
FIG. 3(a) shows the state that a surface of a piezoelectric material substrate 11 is made a roughened surface.
Figure 3B:
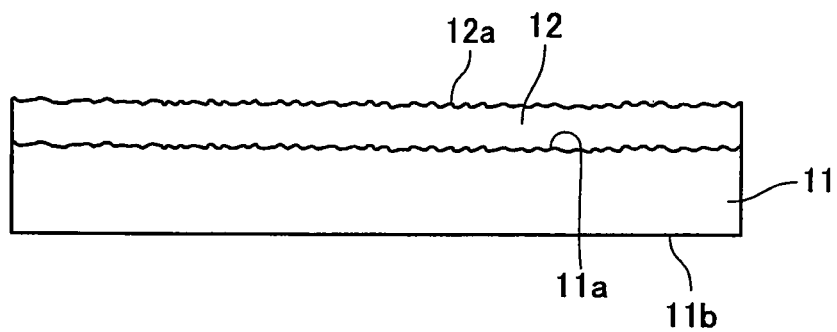
FIG. 3(b) shows the state that a bonding layer 12 is provided on a roughened surface 11a, FIG. 3(c) shows the state that a surface 13a of a bonding layer 13 is subjected to flattening process.

As shown in FIG. 3(a), a surface 11a of a piezoelectric single crystal substrate 11 is processed to form a roughened surface 11a. 11b represents a surface on the opposite side. Then, as shown in FIG. 3(b), an intermediate layer 12 is provided on the roughened surface 11a. At this time, the roughened surface is transcripted onto a surface 12a of the bonding layer 12 and an unevenness is formed.

Figure 3C:
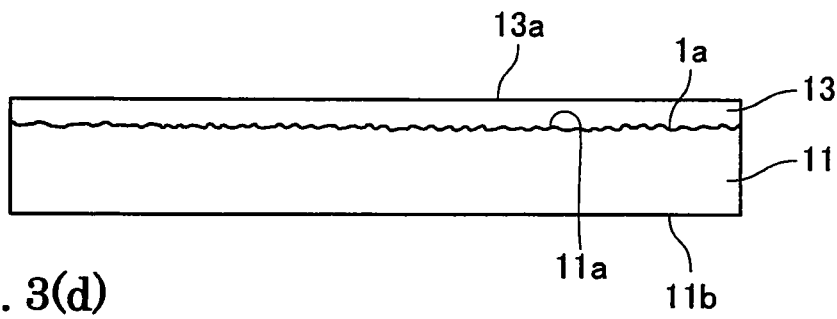
FIG. 3(d) shows the state that a flat surface 14 is activated by neutralized beam A.
Figure 3D:
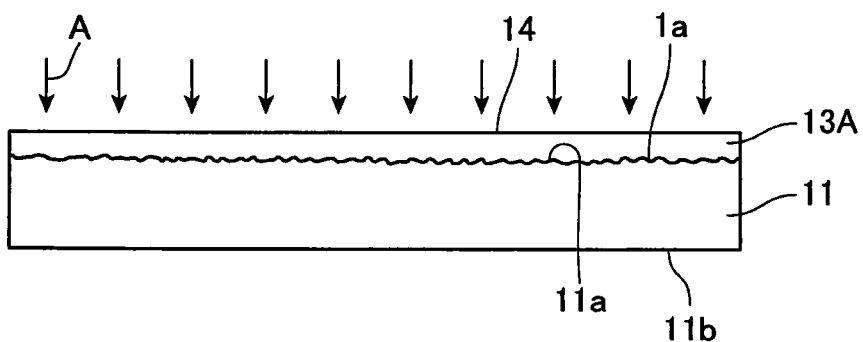

Then, according to a preferred embodiment, the surface 12a of the bonding layer 12 is subjected to a flattening process to form a flat surface 13a as shown in FIG. 3(c). By this flattening process, the thickness of the bonding layer 12 is usually lowered to a thinner bonding layer 13. However, the flattening process is not indispensable. Then, a neutralized beam is irradiated onto the flat surface 13a, as arrow A shows in FIG. 3(d), to activate the surface of the bonding layer 13A and obtain an activated surface 14.

Figure 4A:
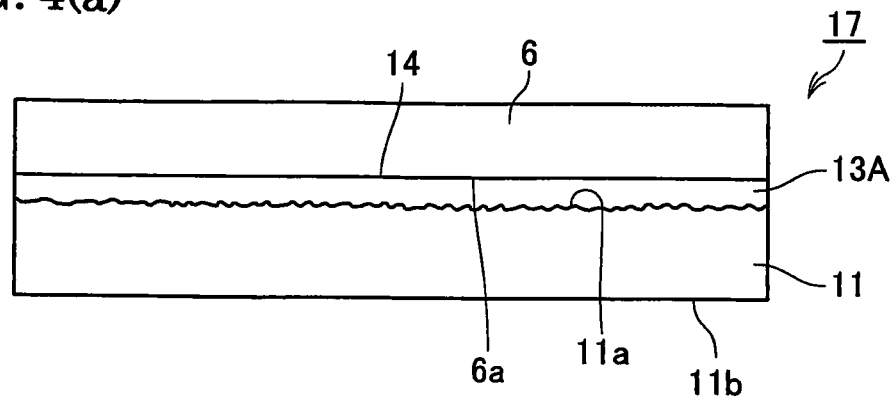
FIG. 4(a) shows the state that a piezoelectric material substrate 11 and a supporting body 6 are bonded.

On the other hand, as shown in FIG. 4(a), a neutralized beam is irradiated onto a surface of a supporting body 6 to activate it to provide an activated surface 6a. Then, the activated surface 6a of the supporting body 6 and the activated surface 14 of a bonding layer 13A are bonded by direct bonding to obtain a bonded body 17.

Figure 4B:
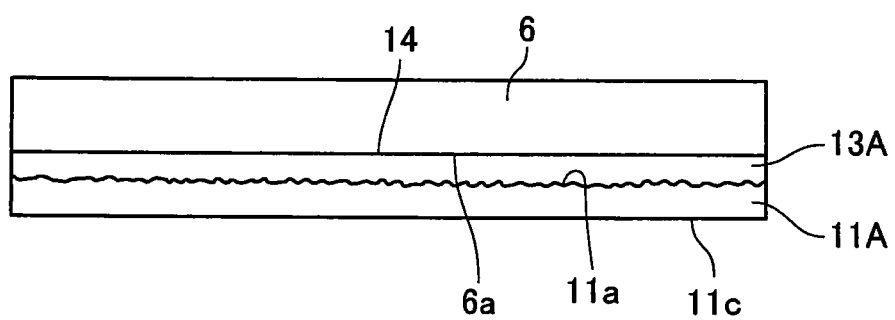
FIG. 4(b) shows the state that the piezoelectric material substrate 11 is thinned by processing.

According to a preferred embodiment, the surface 11b of the piezoelectric single crystal substrate of the bonded body 17 is further subjected to polishing, so that the thickness of the piezoelectric single crystal substrate 11A is made smaller as shown in FIG. 4(b). 11c represents a polished surface.

Figure 4C:
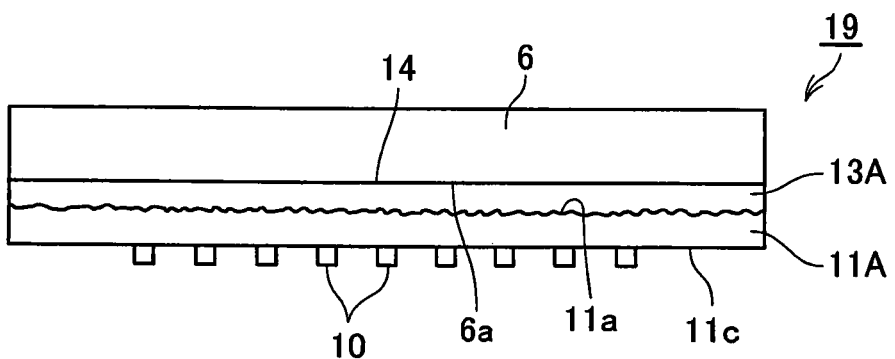
FIG. 4(c) shows the state that electrodes 10 are provided on a piezoelectric material substrate 11A.

Further, in the case of a surface acoustic wave device 19 of FIG. 4(c), predetermined electrodes 10 are formed on a polished surface 11c of the piezoelectric single crystal substrate 11A.

According to an example of FIG. 5, a roughened surface is formed on a piezoelectric material substrate 11, and a silicon oxide film is further formed on the roughened surface.

Figure 5A:
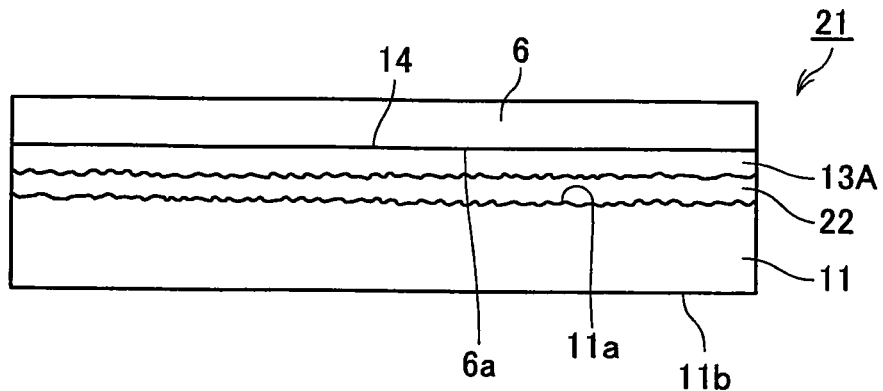
FIG. 5(a) shows the state that a silicon oxide film 22 is provided on a roughened surface 11a of the piezoelectric substrate 11, a bonding layer 13A is provided on the silicon oxide film 22 and the bonding layer 13A is directly bonded to a surface 6a of the supporting body 6.

That is, as shown in FIG. 5(a), a surface of the piezoelectric material substrate 11 is processed to form a roughened surface. Then, a silicon oxide film 22 is formed on the roughened surface 11a.

Then, a bonding layer is further provided on a surface of the silicon oxide film 22, and the surface of the bonding layer is subjected to a flattening process to form a flat surface. Then, a neutralized beam is irradiated onto the flat surface to activate the surface of a bonding layer 13A to provide an activated surface 14.

On the other hand, a neutralized beam is irradiated onto a surface of a supporting body 6 to activate it to provide an activated surface 6a. Then, the activated surface 6a of the supporting body 6 and the activated surface 14 of the bonding layer 13A are bonded by direct bonding to obtain a bonded body 21.

Figure 5B:
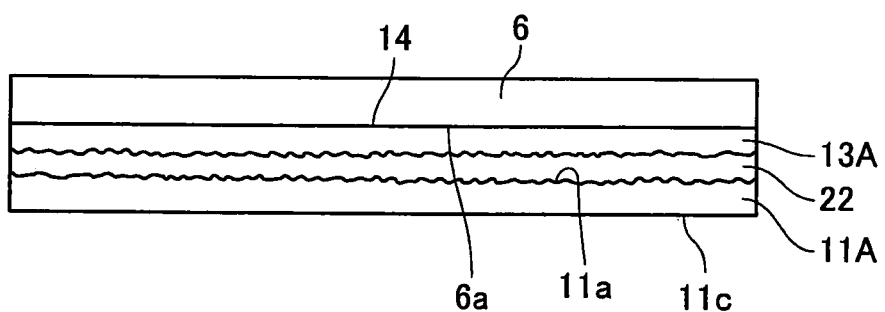
FIG. 5(b) shows the state that the piezoelectric material substrate 11A is thinned.
Figure 5C:
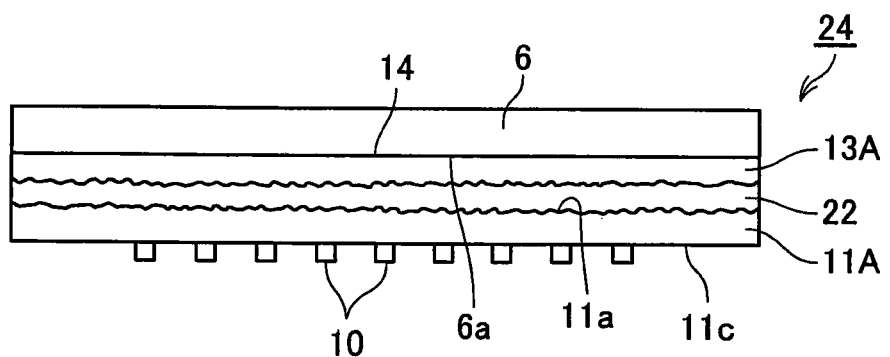
FIG. 5(c) shows the state that electrodes 10 are provided on the piezoelectric material substrate 11A.

According to a preferred embodiment, the surface 11b of the piezoelectric single crystal substrate of the bonded body 17 is further subjected to polishing, so that the thickness of the piezoelectric single crystal substrate 11A is made smaller as shown in FIG. 5(b). 11c represents a polished surface. In the case of a surface acoustic wave device 24 of FIG. 5(c), predetermined electrodes 10 are formed on a polished surface 11c of the piezoelectric single crystal substrate 11A.

According to the second invention, a piezoelectric material substrate composed of a piezoelectric single crystal and a supporting body composed of a single crystal are bonded. That is, a bonding layer is formed over the supporting body, and the bonding layer is composed of one or more materials selected from the group consisting of silicon nitride, aluminum nitride, alumina, tantalum pentoxide, mullite, niobium pentoxide and titanium oxide. A neutralized beam is irradiated onto a surface of the bonding layer and a surface of the piezoelectric material substrate to activate the surface of the bonding layer and the surface of the piezoelectric material substrate. Then, the surface of the bonding layer and the surface of the piezoelectric material substrate are directly bonded to obtain a bonded body.

FIGS. 6 and 7 relate to an embodiment of the second invention. Further, FIGS. 6 and 7 relate to an embodiment in which a silicon oxide film 2 is provided on a supporting body 6.

Figure 6A:
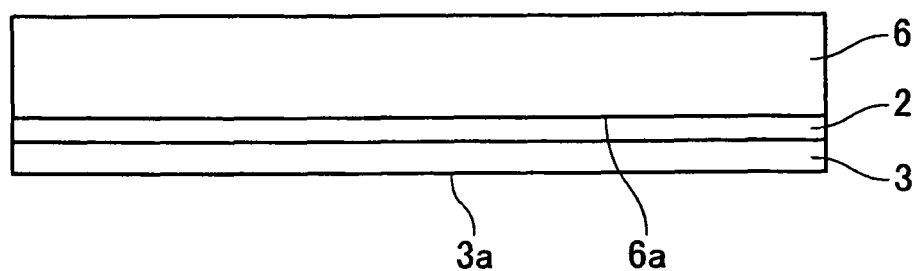
FIG. 6(a) shows the state that the silicon oxide film 2 and bonding layer 3 are provided on the supporting body 6.

As shown in FIG. 6(a), the silicon oxide film 2 is provided on a surface 6a of the supporting body 6, and a bonding layer 3 is provided on the silicon oxide film 2. At this time, an unevenness may be present on a surface 3a of the bonding layer 3.

Figure 6B:
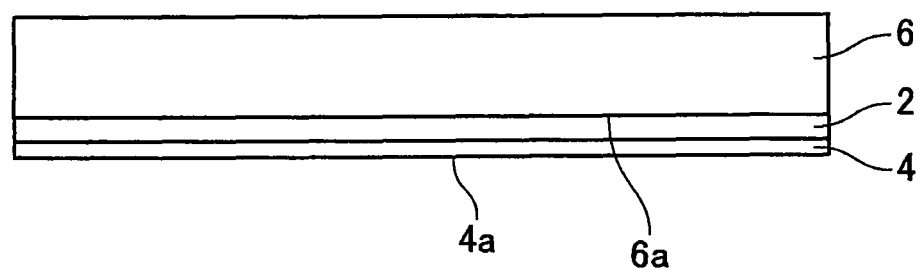
FIG. 6(b) shows the state that the surface 3a of the bonding layer 3 is subjected to a flattening process.
Figure 6C:
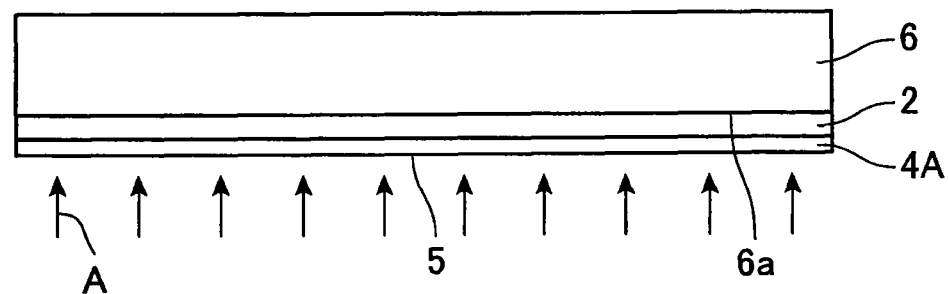
FIG. 6(c) shows the state that the flat surface is activated by neutralized beam A.

Then, according to a preferred embodiment, the surface 3a of the bonding layer 3 is subjected to a flattening process to form a flat surface 4a of a bonding layer 4, as shown in FIG. 6(b). By this flattening process, a thickness of the bonding layer 3 is usually lowered to the thinner bonding layer 4. However, the flattening process is not indispensable. Then, a neutralized beam is irradiated onto the flat surface 4a, as arrow A shows in FIG. 6(c), to activate the surface of the bonding layer 4A to obtain an activated surface 5.

Figure 7A:
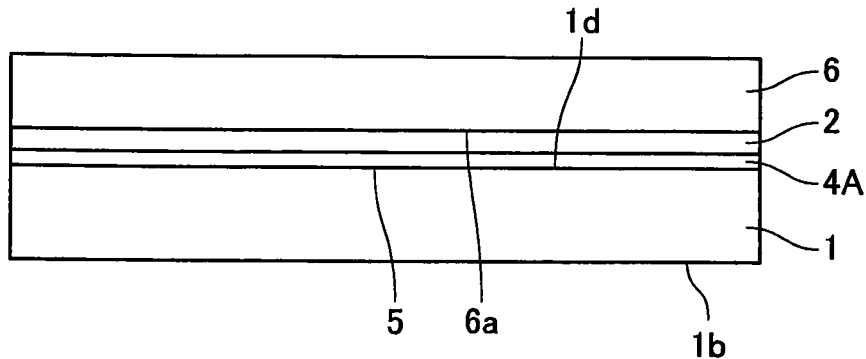
FIG. 7(a) shows the state that the supporting body 6 and piezoelectric material substrate 1 are bonded.

On the other hand, a neutralized beam is irradiated onto a surface of a piezoelectric single crystal substrate 1 to activate it to provide an activated surface 1d (FIG. 7(a)). Then, the activated surface 5 of the bonding layer 4A on the supporting body 6 and the activated surface 1d of the piezoelectric single crystal substrate 1 are bonded by direct bonding to obtain a bonded body of FIG. 7(a).

Figure 7B:
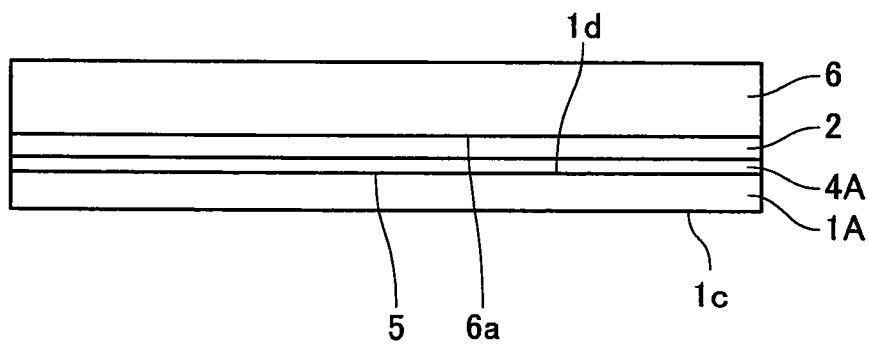
FIG. 7(b) shows the state that the piezoelectric material substrate 1A is further thinned by processing.
Figure 7C:
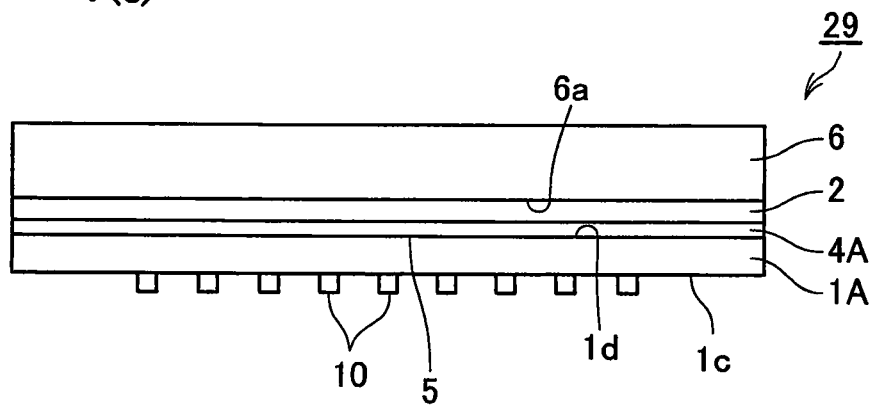
FIG. 7(c) shows the state that electrodes 10 are provided on the piezoelectric material substrate 1A.

According to a preferred embodiment, the surface 1b of the piezoelectric single crystal substrate of the bonded body is further subjected to polishing, so that the thickness of a piezoelectric single crystal substrate 1A is made smaller as shown in FIG. 7(b). Numeral 1c represents a polished surface. According to FIG. 7(c), predetermined electrodes 10 are formed on a polished surface 1c of the piezoelectric single crystal substrate 1A to produce an acoustic wave device 29.

According to the embodiment of FIGS. 6 and 7, the silicon oxide film and bonding layer are provided in this order on the supporting body 6. However, the surface 6a of the supporting body 6 may be made a roughened surface, and the bonding layer may directly be provided on the roughened surface without an intervening silicon oxide film.

According to the third invention, a method of bonding a piezoelectric material substrate and a supporting body composed of a single crystal is provided. That is, there is provided, on the piezoelectric material substrate, a first bonding layer composed of one or more materials selected from the group consisting of silicon nitride, aluminum nitride, alumina, tantalum pentoxide, mullite, niobium pentoxide and titanium oxide. Further, there is provided, on the supporting body, a second bonding layer composed of one or more materials selected from the group consisting of silicon nitride, aluminum nitride, alumina, tantalum pentoxide, mullite, niobium pentoxide and titanium oxide. A neutralized beam is irradiated onto each of the surfaces of the first and second bonding layers activate them. Then, the surface of the first bonding layer and the surface of the second bonding layer are bonded by direct bonding.

FIGS. 8 to 13 relate to embodiments of the third invention. Further, FIGS. 8 and 9 relate to an embodiment in which a silicon oxide film 2 is provided on a piezoelectric material substrate 1 and a silicon oxide film 2 is further provided on a supporting body 6.

Figure 8A:
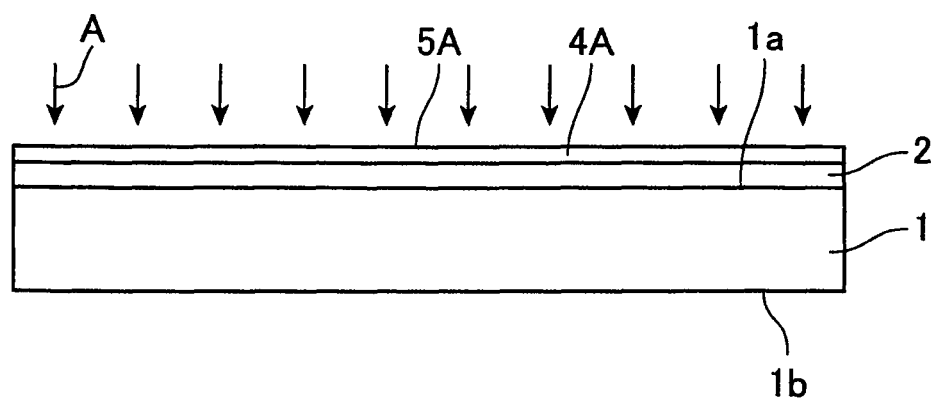
FIG. 8(a) shows the state that the flat surfaces of the piezoelectric material layer 1 and of a first bonding layer 4A on the silicon oxide film 2 are activated.

As shown in FIG. 8(a), a silicon oxide film 2 is provided on a surface 1a of a piezoelectric material substrate 1 and a first bonding layer is provided on the silicon oxide film 2. Then, according to a preferred embodiment, a surface of the first bonding layer 3 is subjected to a flattening process to form a flat surface, and a neutralized beam is irradiated onto the flat surface, as shown by arrow A, to activate the surface of a first bonding layer 4A to provide an activated surface 5A.

Figure 8B:
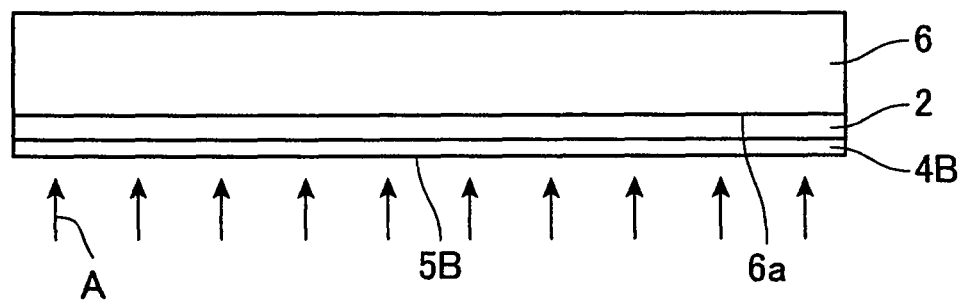
FIG. 8(b) shows the state that a flat surface of a second bonding layer 4B on the supporting body 6 is activated.

On the other hand, as shown in FIG. 8(b), a silicon oxide film 2 is provided on a surface of a supporting body 6 and a second bonding layer is provided on the silicon oxide film 2. Then, according to a preferred embodiment, a surface of the second bonding layer is subjected to a flattening process to form a flat surface, and a neutralized beam is irradiated onto the flat surface, as shown by arrow A, to activate the surface of a second bonding layer 4B to provide an activated surface 5B.

Figure 9A:
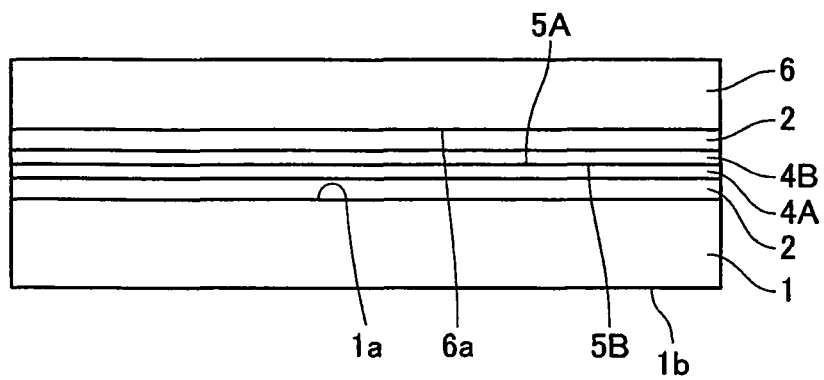
FIG. 9(a) shows a bonded body of the piezoelectric material substrate 1 and supporting body 6.
Figure 9B:
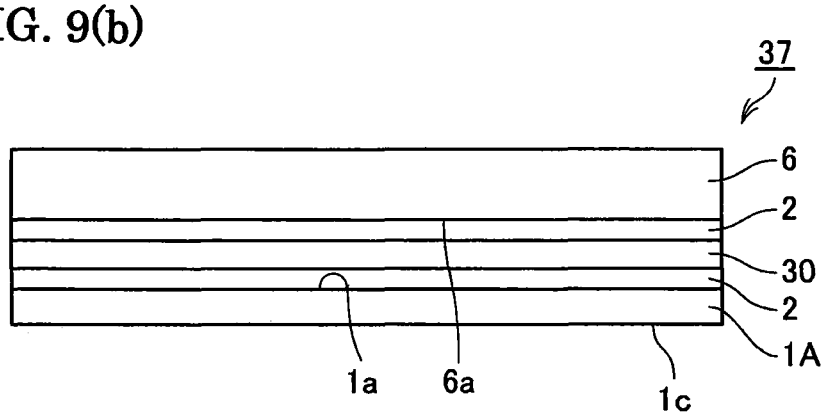
FIG. 9(b) shows the state that the piezoelectric material substrate 1A is thinned.
Figure 9C:
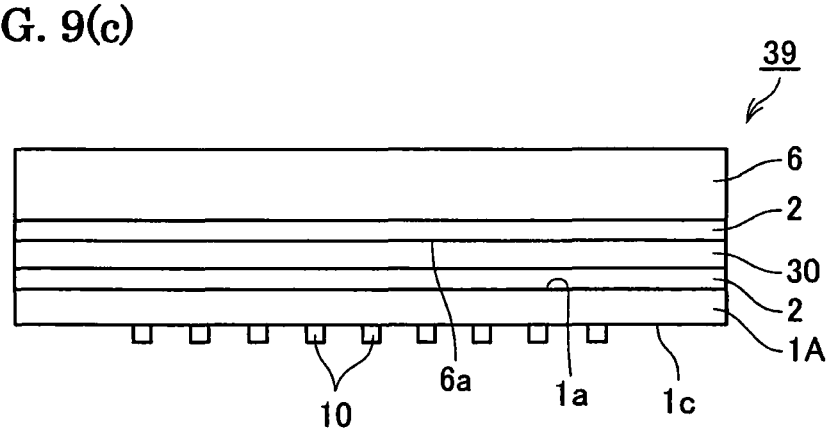
FIG. 9(c) shows the state that electrodes 10 are provided on the piezoelectric material substrate 1A.

Then, the activated surface 5A of the first bonding layer 4A of the piezoelectric material substrate 1 and the activated surface 5B of the second bonding layer 4B on the supporting body 6 are bonded by direct bonding (refer to FIG. 9(a)). As a result, the bonding layers 4A and 4B are integrated to form a bonding layer 30 to obtain a bonded body 37 (refer to FIG. 9(a)). According to a preferred embodiment, the surface 1b of the piezoelectric single crystal substrate of the bonded body is further subjected to polishing, so that the thickness of a piezoelectric single crystal substrate 1A is made smaller as shown in FIG. 9(b). According to FIG. 9(c), predetermined electrodes 10 are formed on a polished surface 1c of the piezoelectric single crystal substrate 1A to produce an acoustic wave device 39.

Figure 10A:
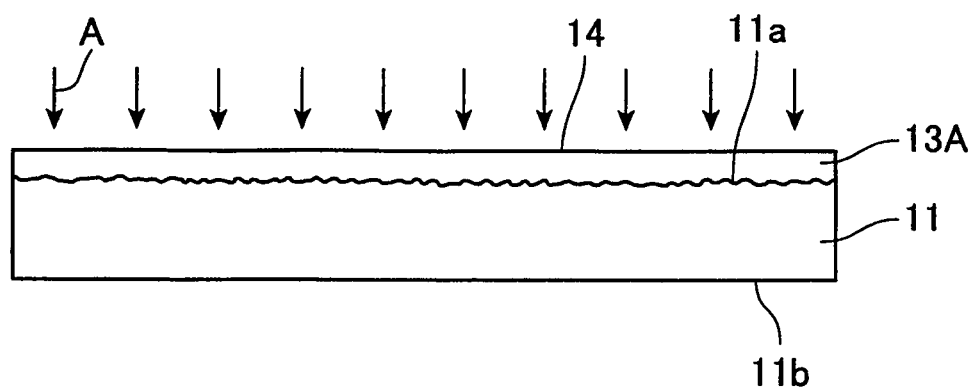
FIG. 10(a) shows the state that a surface 14A of a first bonding layer 13A on the piezoelectric material substrate 11 is activated.

According to an embodiment shown in FIGS. 10 and 11, a roughened surface is provided on a piezoelectric material substrate 11. That is, as shown in FIG. 10(a), a surface of the piezoelectric material substrate 11 is made a roughened surface 11a, and a first bonding layer 13A is formed thereon. The surface of the first bonding layer 13A is subjected to a flattening process to form a flat surface. Then, a neutralized beam is irradiated onto the flat surface, as shown by arrow A, to activate the surface of the first bonding layer 13A and obtain an activated surface 14.

Figure 10B:
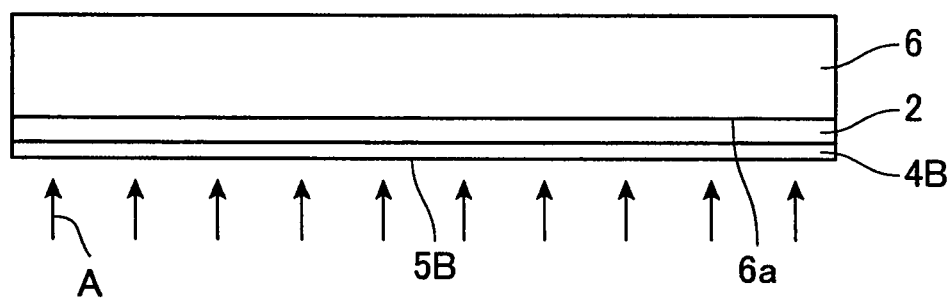
FIG. 10(b) shows the state that a flat surface 5B of a second bonding layer 4B on the supporting body 6 is activated.

On the other hand, as shown in FIG. 10(b), a silicon oxide film 2 is provided on a surface of a supporting body 6, and a second bonding layer is provided thereon. Then, the surface of the second bonding layer is subjected to a flattening process to form a flat surface, and a neutralized beam is irradiated onto the flat surface, as shown by arrow A, to activate the surface of the second bonding layer 4B to obtain an activated surface 5B.

Figure 11A:
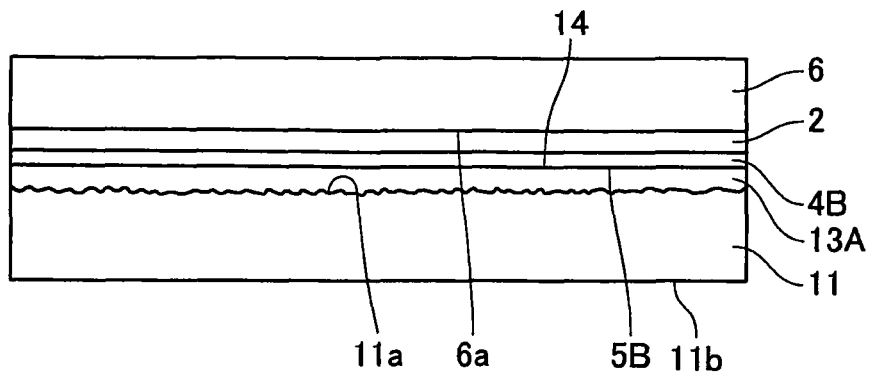
FIG. 11(a) shows a bonded body of the piezoelectric material substrate 11 and supporting body 6.
Figure 11B:
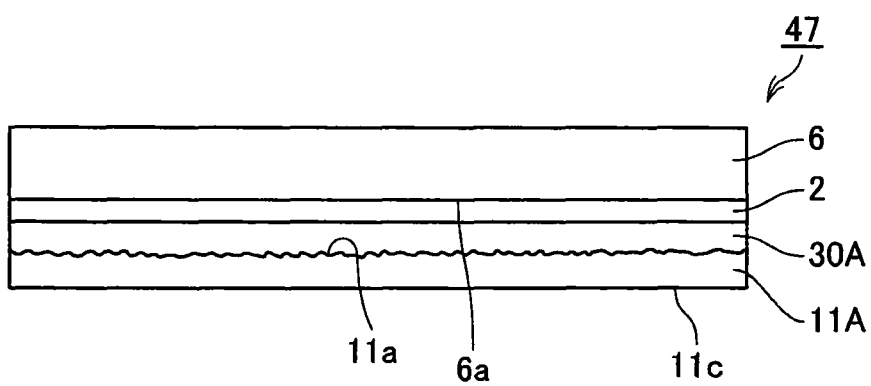
FIG. 11(b) shows the state that the piezoelectric material substrate 11A is thinned.
Figure 11C:
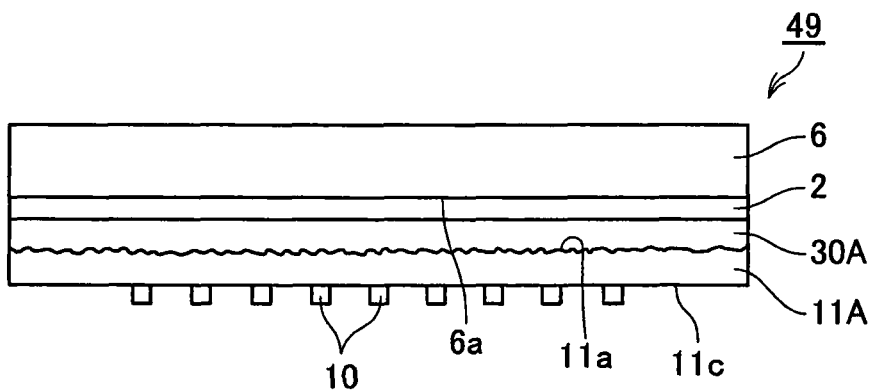
FIG. 11(c) shows the state that electrodes 10 are provided on the piezoelectric material substrate 11A.

Then, the activated surface 14 of the first bonding layer 13A on the piezoelectric material substrate 1 and the activated surface 5B of the second bonding layer 4B on the supporting body 6 are bonded by direct bonding (refer to FIG. 11(a)). As a result, the bonding layers 13A and 4B are integrated to form a bonding layer 30A to obtain a bonded body 47 (refer to FIG. 11(a)). According to a preferred embodiment, the surface 11b of the piezoelectric single crystal substrate of the bonded body is further subjected to polishing, so that the thickness of a piezoelectric single crystal substrate 11A is made smaller as shown in FIG. 11(b). According to FIG. 11(c), predetermined electrodes 10 are formed on a polished surface 11c of the piezoelectric single crystal substrate 11A to produce an acoustic wave device 49.

Figure 12A:
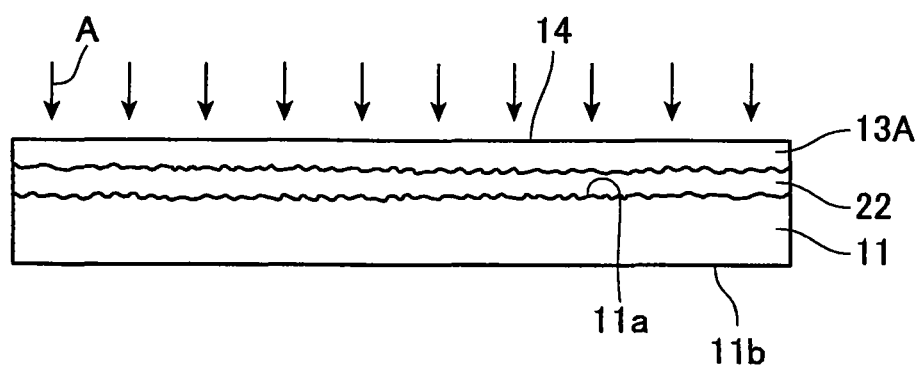
FIG. 12(a) shows the state that the surface 14 of the first bonding layer 13A on the piezoelectric material substrate 11 is activated.

According to an embodiment shown in FIGS. 12 and 13, a roughened surface is provided on a piezoelectric material substrate 11, and a silicon oxide film is provided thereon. Further, a silicon oxide film is formed on the supporting body. As shown in FIG. 12(a), a surface of the piezoelectric material substrate 11 is made a roughened surface 11a, and a silicon oxide film 22 is provided thereon. The surface of the silicon oxide film 22 becomes a roughened surface, too. Then, a first bonding layer 13A is provided on the silicon oxide film 22. Then, the surface of the first bonding layer 13A is subjected to a flattening process to form a flat surface, and a neutralized beam is irradiated onto the flat surface, as shown by arrow A, to activate the surface of the first bonding layer 13A and obtain an activated surface 14.

Figure 12B:
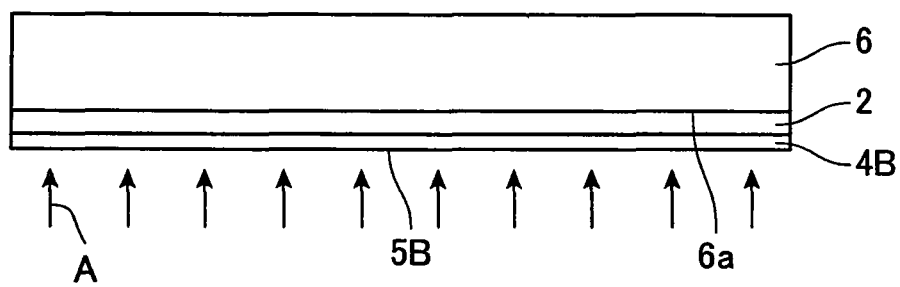
FIG. 12(b) shows the state that a flat surface 5B of the second bonding layer 4B on the supporting body 6 is activated.

On the other hand, as shown in FIG. 12(b), the silicon oxide film 2 is formed on the supporting body 6, and the second bonding layer is provided thereon. Then, the surface of the second bonding layer is subjected to a flattening process to form a flat surface, and a neutralized beam is irradiated onto the flat surface, as shown by arrow A, to activate the surface of the second bonding layer 4B and obtain an activated surface 5B.

Figure 13A:
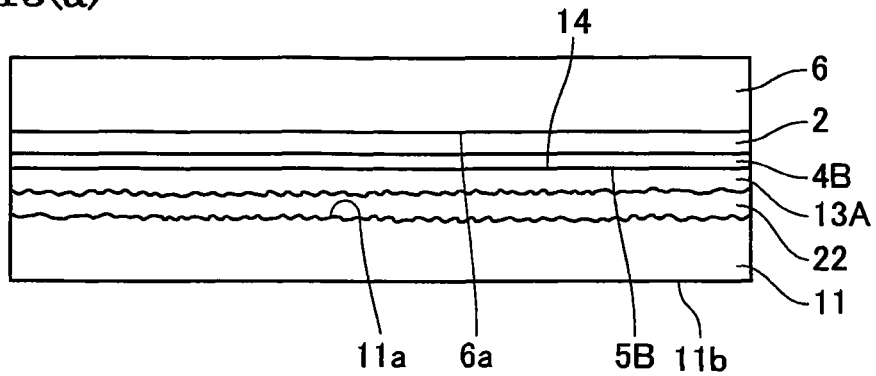
FIG. 13(a) shows a bonded body of the piezoelectric material substrate 11 and supporting body 6.
Figure 13B:
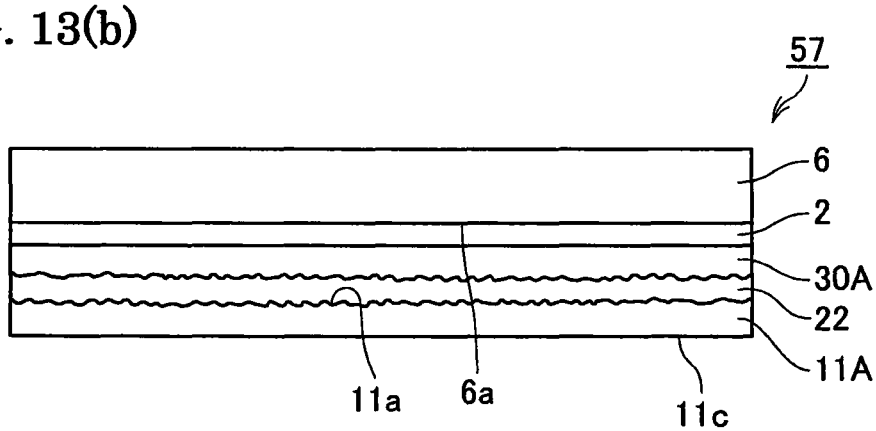
FIG. 13(b) shows the state that the piezoelectric material substrate 11A is thinned.
Figure 13C:
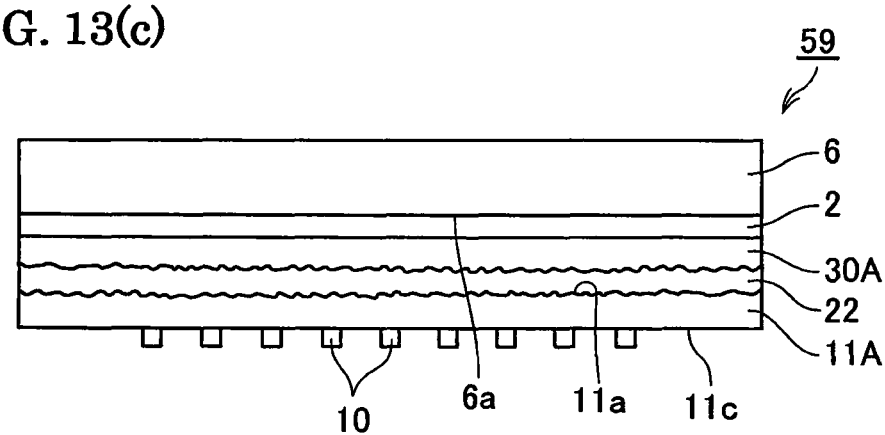
FIG. 13(c) shows the state that electrodes 10 are provided on the piezoelectric material substrate 11A.

Then, the activated surface 14 of the first bonding layer 13A on the piezoelectric material substrate 11 and the activated surface 5B of the second bonding layer 4B on the supporting body 6 are bonded by direct bonding (refer to FIG. 13(a)). As a result, the bonding layers 13A and 4B are integrated to form a bonding layer 30A and obtain a bonded body 57 (refer to FIG. 13(a)). According to a preferred embodiment, the surface 11b of the piezoelectric single crystal substrate of the bonded body is further subjected to polishing, so that the thickness of a piezoelectric single crystal substrate 11A is made smaller as shown in FIG. 13(b). According to FIG. 13(c), predetermined electrodes 10 are formed on a polished surface 11c of the piezoelectric single crystal substrate 11A to produce an acoustic wave device 59.

Respective constituents of the present invention will be described further in detail below.

Applications of the bonded bodies of the present invention are not particularly limited, and they can be appropriately applied to an acoustic wave device and optical device, for example.

As an acoustic wave device, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for an oscillating surface acoustic wave and IDT electrode on the output side for receiving the surface acoustic wave, on the surface of the piezoelectric single crystal substrate. By applying a high frequency signal on the IDT electrode on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface of the piezoelectric substrate and that the metal film on the piezoelectric substrate is exposed through a cavity provided in the supporting body. The materials of the metal films include aluminum, an aluminum alloy, copper, gold or the like, for example. Further, in the case that the Lamb type wave device is produced, a composite substrate having the piezoelectric substrate without the metal film on the bottom surface may be used.

Further, a metal film and an insulating film may be provided on the bottom surface of the piezoelectric material substrate. The metal film plays a role of electrodes in the case that the thin film resonator is produced as the acoustic wave device. In this case, the thin film resonator has the structure that electrodes are formed on the upper and bottom surfaces of the piezoelectric substrate and the insulating film is made a cavity to expose the metal film on the piezoelectric substrate. The materials of the metal films include molybdenum, ruthenium, tungsten, chromium, aluminum or the like, for example. Further, the materials of the insulating films include silicon dioxide, phosphorus silicate glass, boron phosphorus silicate glass or the like.

Further, as the optical device, an optical switching device, wavelength conversion device and optical modulating device may be listed. Further, a periodic domain inversion structure may be formed in the piezoelectric material substrate.

In the case that the present invention is applied to an optical device, the size of the optical device can be reduced. Further, particularly in the case that a periodic domain inversion structure is formed, it is possible to prevent the deterioration of the periodic domain inversion structure by heat treatment. Further, the materials of the bonding layers of the present invention are of high insulation, the generation of domain inversion is prevented during the processing by the neutralized beam before the bonding, and the shape of the domain inversion structure formed in the piezoelectric material substrate is hardly disordered.

The piezoelectric material substrate used in the present invention may be made of a single crystal. In the case that the material of the piezoelectric material substrate is a single crystal, it is possible to activate a surface of the piezoelectric material substrate by a neutralized beam. However, in the case that the silicon oxide film is provided on the piezoelectric material substrate or that the surface of the piezoelectric material substrate is roughened, it is not possible to activate the surfaces by a neutralized beam. The bonding layer is thus provided and the surface is flattened and activated by the neutralized beam so that the piezoelectric material substrate can be bonded to the supporting body by direct bonding.

Specifically, as the material of the piezoelectric material substrate, single crystals of lithium tantalate (LT), lithium niobate (LN), lithium niobate-lithium tantalate solid solution, quartz and lithium borate may be listed. Among them, LT or LN are more preferred. As LT or LN has a high propagation speed of a surface acoustic wave and large electro-mechanical coupling factor, it is preferred for use in a piezoelectric surface wave device for high frequency and wide-band frequency applications. Further, the normal direction of the main surface of the piezoelectric material substrate is not particularly limited. However, in the case that the piezoelectric material substrate is made of LT, for example, it is preferred to use the substrate rotated towards the Y-axis or Z-axis by 36 to 47° (for example 42°) with respect to the X-axis, which is a direction of propagation of a surface acoustic wave, because of a low propagation loss. In the case that the piezoelectric material substrate is made of LN, it is preferred to use the substrate rotated towards the Y-axis or Z-axis by 60 to 68° (for example 64°) with respect to the X-axis, which is a direction of propagation of a surface acoustic wave, because of a lower propagation loss. Further, although the size of the piezoelectric material substrate is not particularly limited, for example, the diameter may be 50 to 150 mm and thickness may be 0.2 to 60 µm.

The material of the supporting body is a single crystal. It may preferably be a material selected from the group consisting of silicon, sapphire and quartz. In the case that an acoustic wave device is formed on a composite substrate produced by bonding according to the inventive method, from the viewpoint of improving the temperature characteristics of the acoustic wave device, it is preferred that the thermal expansion coefficient of the material of the supporting body is lower than the thermal expansion coefficient of the piezoelectric material substrate.

According to a preferred embodiment, the silicon oxide film is formed on the piezoelectric material substrate. The silicon oxide film may be a crystalline silicon oxide film or an amorphous silicon oxide film. Further, although the method of forming the silicon oxide film is not limited, sputtering, chemical vapor deposition (CVD) and vapor deposition methods are listed.

Although the thickness of the silicon oxide film is not particularly limited, it may be 0.1 to 1.0 µm.

According to another embodiment, the surface of the piezoelectric material substrate is processed to form a roughened surface. The roughened surface means a surface in which an unevenness is formed periodically and uniformly in a plane, having an arithmetic average roughness of 0.05 µm≤Ra≤0.5 µm, and a height Ry from the lowest bottom of a valley to the highest peak of 0.5 µm≤Ry≤5 µm. The preferred roughness depends on the wavelength of an acoustic wave and is appropriately selected so that the reflection of the bulk wave can be prevented.

Further, the methods of the flattening process include grinding, polishing, etching and sand blasting.

The bonding layer is formed on the roughened surface of the piezoelectric material substrate or on the silicon oxide film, and the bonding layer is made of one or more materials selected from the group consisting of silicon nitride, aluminum nitride, alumina, tantalum pentoxide, mullite, niobium pentoxide and titanium oxide. Although the method of forming the silicon oxide film is not limited, sputtering, chemical vapor deposition (CVD) and vapor deposition methods are listed.

Then, the surfaces of the bonding layer, first bonding layer and second bonding layer are flattened to obtain the flat surfaces. Here, the method of flattening each of the surfaces of the bonding layers includes lapping, chemical mechanical polishing or the like. Further, the flat surface necessarily has a Ra of Ra≤1 nm, preferably has a Ra of 0.3 nm or lower. In the case that the bonding layer, first bonding layer or second bonding layer is formed on the roughened surface of the piezoelectric material substrate, it is particularly preferred to subject the surfaces of the bonding layers to a flattening process. On the other hand, in the case that the surfaces of the piezoelectric material substrate, silicon oxide film and supporting body are flat, although it is not necessary to subject the surfaces of the bonding layer, first bonding layer and second bonding layer to a flattening process, they may be subjected to the flattening process.

Then, a neutralized beam is irradiated onto the surface of the bonding layer, first bonding layer or second bonding layer and the surface of the supporting body to activate the surface of each of the bonding layers and the surface of the supporting body.

When the activation of the surfaces is performed using the neutralized beam, it is preferred to use a system described in patent document 4 to generate the neutralized beam, which is irradiated. That is, a high speed atomic beam source of saddle field type is used as the beam source. Then, an inert gas is introduced into the chamber and a high voltage is applied onto electrodes from a direct current electric source. By this, an electric field of the saddle field type generated between the electrode (positive electrode) and a housing (negative electrode) causes the motion of electrons, e, so that atomic and ion beams derived from the inert gas are generated. Among the beams reached at a grid, the ion beam is neutralized at the grid, and the beam of neutral atoms is emitted from the high speed atomic beam source. Atomic species forming the beam may preferably be an inert gas (argon, nitrogen or the like).

The voltage during the activation by the irradiation of the beam may preferably be 0.5 to 2.0 kV and the current is preferably 50 to 200 mA.

Then, the activated surfaces are contacted and bonded with each other under a vacuum atmosphere. The temperature at this time may be an ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

EXAMPLES

Example A1

A bonded body was produced, according to the method of the first invention, described referring to FIGS. 1 and 2.

Specifically, a substrate (LT substrate) of lithium tantalate having an orientation flat (OF) part, a diameter of 4 inches and thickness of 250 μm was used as the piezoelectric material substrate 1. Further, as the supporting body 6, a body having an OF part, a diameter of 4 inches, a thickness of 230 μm and made of silicon was prepared. As the LT substrate, a 46° Y-cut X-propagation LT substrate was used, in which the direction of propagation of the surface acoustic wave (SAW) is X and the Y-cut plate is rotated in a cutting angle. The surface 1a of the piezoelectric material substrate 1 and the surface 6a of the supporting body 6 were mirror-polished to an arithmetic average roughness Ra of 1 nm. The arithmetic average roughness was measured by an atomic force microscope (AFM) in a visual field of a square with a length of 10 μm and a width of 10 μm.

Then, a silicon oxide film 2 was formed on the surface 1a of the piezoelectric material substrate 1 of 1.0 μm by a sputtering method. The arithmetic average roughness Ra after the film-formation was 2 nm. Then, a bonding layer 3 of mullite was formed on the silicon oxide film 2 of 1.0 μm by a CVD method. The Ra after the film-formation was 2.0 nm. Then, the bonding layer 3 was subjected to chemical mechanical polishing (CMP), so that the film thickness was 0.5 μm and Ra was 0.3 nm.

Then, the flat surface 4a of the bonding layer 4 and the surface 6a of the supporting body 6 were cleaned to remove contamination, followed by introduction into a vacuum chamber. The chamber was evacuated to an order of $10^{-6}$ Pa and a high speed atomic beam (acceleration voltage of 1 kV and Ar flow rate of 27 sccm) was irradiated onto the bonding surfaces of the respective substrates for 120 sec. Then, the beam-irradiated surface (activated surface) 5 of the piezoelectric material substrate 3A and activated surface 6a of the supporting body 6 were contacted with each other, followed by pressurizing at 10000N for 2 minutes to bond the respective substrates.

Then, the surface 1b of the piezoelectric material substrate 1 was ground and polished until the thickness was changed from the initial thickness of 250 μm to 3 μm (refer to FIG. 2(b)). The separation of the bonded parts was not observed during the grinding and polishing steps of the piezoelectric material substrate. Further, the bonding strength was evaluated by the crack opening method and was 1.5 $J/m^2$.

Example A2

In Example A1, the material of the bonding layer 3 was alumina and the film-formation of the bonding layer 3 was performed by a sputtering method. The other procedures were the same as those in Example A1 to produce the bonded body.

As a result, the separation of the bonded parts was not observed during the grinding and polishing steps of the piezoelectric material substrate. Further, the bonding strength was evaluated by the crack opening method and proved to be 1.4 $J/m^2$.

Example A3

In Example A1, the material of the bonding layer 3 was tantalum pentoxide ($Ta_2O_5$) and the film-formation of the bonding layer was performed by a sputtering method. The other procedures were the same as those in Example A1 to produce the bonded body.

As a result, the separation of the bonded parts was not observed during the grinding and polishing steps of the piezoelectric material substrate. Further, the bonding strength was evaluated by the crack opening method and was 1.5 $J/m^2$.

Example A4

In Example A1, the material of the bonding layer 3 was silicon nitride ($Si_3N_4$) and the film-formation of the bonding layer 3 was performed by a sputtering method. The other procedures were the same as those in Example A1 to produce the bonded body.

As a result, the separation of the bonded parts was not observed during the grinding and polishing steps of the piezoelectric material substrate. Further, the bonding strength was evaluated by the crack opening method and was 1.4 $J/m^2$.

Example A5

In Example A1, the material of the bonding layer 3 was aluminum nitride (AlN) and the film-formation of the bonding layer was performed by a sputtering method. The other procedures were the same as those in Example A1 to produce the bonded body.

As a result, the separation of the bonded parts was not observed during the grinding and polishing steps of the piezoelectric material substrate. Further, the bonding strength was evaluated by the crack opening method and was 1.3 J/m².

Example A6

In Example A1, the material of the bonding layer 3 was niobium pentoxide ($Nb_2O_5$) and the film-formation of the bonding layer was performed by a sputtering method. The other procedures were the same as those in Example A1 to produce the bonded body.

As a result, the separation of the bonded parts was not observed during the grinding and polishing steps of the piezoelectric material substrate. Further, the bonding strength was evaluated by the crack opening method and was 1.8 J/m².

Example A7

In Example A1, the material of the bonding layer 3 was titanium oxide ($TiO_2$) and the film-formation of the bonding layer was performed by a sputtering method. The other procedures were the same as those in Example A1 to produce the bonded body.

As a result, the separation of the bonded parts was not observed during the grinding and polishing steps of the piezoelectric material substrate. Further, the bonding strength was evaluated by crack opening method and was 1.6 J/m².

Comparative Example A1

In Example A1, the bonding layer 3 was not formed. The other procedures were the same as those in Example A1 to produce the bonded body.

As a result, the separation of the bonded parts was observed during the grinding and polishing steps of the piezoelectric material substrate. Further, the bonding strength was evaluated by the crack opening method and was 0.1 J/m².

Comparative Example A2

The tantalum pentoxide layer was provided as the bonding layer 3 as in Example A3. Then, the surface of the bonding layer and the surface of the supporting body were subjected to surface activation by a plasma activation method. The other procedures were the same as those in Example A4 to produce the bonded body. The inside of a chamber was evacuated to an order of $10^{-1}$ Pa, $N_2$ plasma (power of 200 W) was then irradiated onto the surface of a wafer for 60 seconds, the wafer was then taken out into the air and washed by pure water. The bonding was further performed in the air and a load of 2000N was applied for 2 minutes.

As a result, the separation of the bonded parts was observed during the grinding and polishing steps of the piezoelectric material substrate. Further, the bonding strength was evaluated by the crack opening method and was 0.3 J/m².

Example B1

A bonded body was produced, according to the method of the first invention, described referring to FIGS. 3 and 4.

Specifically, a substrate (LT substrate) of lithium tantalate having an orientation flat (OF) part, a diameter of 4 inches and thickness of 250 μm was used as the piezoelectric single crystal substrate 11. Further, as the supporting body 6, a body having an OF part, a diameter of 4 inches, a thickness of 230 μm and made of silicon was prepared. As the LT substrate, a 46° Y-cut X-propagation LT substrate was used, in which the direction of propagation of the surface acoustic wave (SAW) is X and the Y-cut plate is rotated in a cutting angle.

The surface 11a of the piezoelectric material substrate 11 was roughened by a lapping machine to provide a roughened surface whose arithmetic average roughness Ra was 0.1 μm. The surface 6a of the supporting body 6 was mirror-polished to an arithmetic average roughness Ra of 1 nm. The arithmetic average roughness was measured by an atomic force microscope (AFM) in a visual field of a square with a length of 10 μm and a width of 10 μm.

Then, a bonding layer 12 made of mullite was formed on the roughened surface of the piezoelectric material substrate of a thickness of 2 μm to embed a micro unevenness to the bottom surface. Besides, the surface 12a of the bonding layer at this stage had an arithmetic average roughness Ra of 0.1 μm. The surface 12a of the bonding layer was then subjected to chemical mechanical polishing (CMP) so that the film thickness was made 0.5 μm and Ra was made 0.3 nm.

Then, the flat surface 13a of the bonding layer and the surface 6a of the supporting body were cleaned to remove contamination, followed by introduction into a vacuum chamber. The chamber was evacuated to an order of $10^{-6}$ Pa and a high speed atomic beam (acceleration voltage of 1 kV and Ar flow rate of 27 sccm) was irradiated onto the bonding surfaces of the respective substrates for 120 sec. Then, the activated flat surface 14 of the bonding layer and activated surface 6a of the supporting body were contacted with each other, followed by pressurizing at 1000N for 2 minutes to bond the respective substrates.

Then, the surface 11c of the piezoelectric material substrate 11 was ground and polished until the thickness was changed from the initial thickness of 250 μm to 20 μm.

As a result, the separation of the bonded parts was not observed during the grinding and polishing steps of the piezoelectric material substrate. Further, the bonding strength was evaluated by the crack opening method and proved to be 1.5 J/m².

The thus produced bonded body was used to produce a SAW (surface acoustic wave) filter, which was then heated at 300° C. Separation along the interface and shift of the frequency were not observed.

Example B2

In Example B1, the material of the bonding layer 3 was alumina. The other procedures were the same as those in Example B1 to produce the bonded body. As a result, the separation of the bonded parts was not observed during the grinding and polishing steps of the piezoelectric material substrate. Further, the bonding strength was evaluated by the crack opening method and was 1.4 J/m².

The thus produced bonded body was used to produce a SAW (surface acoustic wave) filter, which was then heated at 300° C. Separation along the interface and shift of the frequency were not observed.

Example B3

In Example B1, the material of the bonding layer 3 was tantalum pentoxide ($Ta_2O_5$). The other procedures were the same as those in Example B1 to produce the bonded body. As a result, the separation of the bonded parts was not observed during the grinding and polishing steps of the piezoelectric material substrate. Further, the bonding strength was evaluated by the crack opening method and was 1.5 J/m².

The thus produced bonded body was used to produce a SAW (surface acoustic wave) filter, which was then heated at 300° C. Separation along the interface and shift of the frequency were not observed.

Example B4

In Example B1, the material of the bonding layer 3 was silicon nitride ($Si_3N_4$). The other procedures were the same as those in Example B1 to produce the bonded body. As a result, the separation of the bonded parts was not observed during the grinding and polishing steps of the piezoelectric material substrate. Further, the bonding strength was evaluated by the crack opening method and was 1.4 J/m².

The thus produced bonded body was used to produce a SAW (surface acoustic wave) filter, which was then heated at 300° C. Separation along the interface and shift of the frequency were not observed.

Example B5

In Example B1, the material of the bonding layer 3 was aluminum nitride (AlN). The other procedures were the same as those in Example B1 to produce the bonded body. As a result, the separation of the bonded parts was not observed during the grinding and polishing steps of the piezoelectric material substrate. Further, the bonding strength was evaluated by the crack opening method and was 1.3 J/m².

The thus produced bonded body was used to produce a SAW (surface acoustic wave) filter, which was then heated at 300° C. Separation along the interface and shift of the frequency were not observed.

Example B6

In Example B1, the material of the bonding layer 3 was niobium pentoxide ($Nb_2O_5$). The other procedures were the same as those in Example B1 to produce the bonded body. As a result, the separation of the bonded parts was not observed during the grinding and polishing steps of the piezoelectric material substrate. Further, the bonding strength was evaluated by the crack opening method and was 1.8 J/m².

The thus produced bonded body was used to produce a SAW (surface acoustic wave) filter, which was then heated at 300° C. Separation along the interface and shift of the frequency were not observed.

Example B7

In Example B1, the material of the bonding layer 3 was titanium oxide ($TiO_2$). The other procedures were the same as those in Example B1 to produce the bonded body. As a result, the separation of the bonded parts was not observed during the grinding and polishing steps of the piezoelectric material substrate. Further, the bonding strength was evaluated by the crack opening method and was 1.6 J/m².

The thus produced bonded body was used to produce a SAW (surface acoustic wave) filter, which was then heated at 300° C. Separation along the interface and shift of the frequency were not observed.

Comparative Example B1

A surface acoustic wave filter was produced as in Example B1. However, the material of the bonding layer was a resin, and the substrates were adhered through the resin without directly bonding the substrates. As a result, the separation and shift of the frequency were observed after heating at 300° C.

Comparative Example B2

The tantalum pentoxide layer was provided as the bonding layer 3 as in Example B3. Then, the surface of the bonding layer and the surface of the supporting body were subjected to surface activation by a plasma activation method. The other procedures were the same as those in Example B4 to produce the bonded body. The inside of a chamber was evacuated to an order of $10^{-1}$ Pa, an $N_2$ plasma (power of 200 W) was irradiated onto the surface of a wafer for 60 seconds, the wafer was then taken out into the air and washed by pure water. The bonding was further performed in the air and a load of 2000N was applied for 2 minutes.

As a result, the bonding strength was evaluated directly after the bonding by the crack opening method and was 0.3 J/m². However, separation of the bonded parts occurred during the grinding and polishing steps of the piezoelectric material substrate. It was thus impossible to produce a surface acoustic filter.

Example C1

A bonded body was produced, according to the method of the second invention, described referring to FIGS. 6 and 7.

Specifically, as shown in FIG. 6, as the supporting body 6, a body having an OF part, a diameter of 4 inches, a thickness of 230 μm and made of silicon was prepared. As the LT substrate, a 46° Y-cut X-propagation LT substrate was used, in which the direction of propagation of the surface acoustic wave (SAW) is X and the Y-cut plate is rotated in a cutting angle. The surface 6a of the supporting body 6 was mirror-polished to an arithmetic average roughness Ra of 1 nm. The arithmetic average roughness was measured by an atomic force microscope (AFM) in a visual field of a square with a length of 10 μm and a width of 10 μm.

Then, a silicon oxide film 2 was formed on the surface 6a of the supporting body 6 in 1.0 μm by a sputtering method. The arithmetic average roughness Ra after the film-formation was 2 nm. Then, the bonding layer 3 made of mullite was formed on the silicon oxide film 2 of 1.0 μm by a CVD method. The Ra after the film-formation was 2.0 nm. The bonding layer 3 was then subjected to chemical mechanical polishing (CMP) so that the film thickness was 0.5 μm and Ra was 0.3 nm.

On the other hand, as shown in FIG. 7(a), a substrate (LT substrate) of lithium tantalate having an orientation flat (OF) part, a diameter of 4 inches and thickness of 250p m was used as the piezoelectric material substrate 1.

Then, the flat surface 4a of the bonding layer 4 and the surface 1a of the supporting body 1 were cleaned to remove contamination, followed by introduction into a vacuum chamber. The chamber was evacuated to an order of $10^{-6}$ Pa and a high speed atomic beam (acceleration voltage of 1 kV and Ar flow rate of 27 sccm) was irradiated onto the bonding surfaces of the respective substrates for 120 sec. Then, the activated surface 5 of the bonding layer 4A and activated surface 1d of the piezoelectric single crystal substrate 1 were contacted with each other, followed by pressurizing at 10000N for 2 minutes to bond the respective substrates.

Then, the surface 1b of the piezoelectric material substrate 1 was ground and polished until the thickness was changed from the initial thickness of 250 μm to 3 μm (refer to FIG. 7(b)). The separation of the bonded parts was not observed during the grinding and polishing steps. Further, the bonding strength was evaluated by the crack opening method and was 1.5 J/m$^2$.

Example C2

In Example C1, the material of the bonding layer 3 was alumina and the film-formation of the bonding layer 3 was performed by a sputtering method. The other procedures were the same as those in Example C1 to produce the bonded body.

As a result, the separation of the bonded parts was not observed during the grinding and polishing steps of the piezoelectric material substrate. Further, the bonding strength was evaluated by the crack opening method and was 1.4 J/m$^2$.

Example C3

In Example C1, the material of the bonding layer 3 was tantalum pentoxide ($Ta_2O_5$) and the film-formation of the bonding layer was performed by a sputtering method. The other procedures were the same as those in Example C1 to produce the bonded body.

As a result, the separation of the bonded parts was not observed during the grinding and polishing steps of the piezoelectric material substrate. Further, the bonding strength was evaluated by the crack opening method and was 1.5 J/m$^2$.

Example C4

In Example C1, the material of the bonding layer 3 was silicon nitride ($Si_3N_4$) and the film-formation of the bonding layer 3 was performed by a sputtering method. The other procedures were the same as those in Example C1 to produce the bonded body.

As a result, the separation of the bonded parts was not observed during the grinding and polishing steps of the piezoelectric material substrate. Further, the bonding strength was evaluated by the crack opening method and was 1.4 J/m$^2$.

Example C5

In Example C1, the material of the bonding layer 3 was aluminum nitride (AlN) and the film-formation of the bonding layer 3 was performed by a sputtering method. The other procedures were same as those in Example C1 to produce the bonded body.

As a result, the separation of the bonded parts was not observed during the grinding and polishing steps of the piezoelectric material substrate. Further, the bonding strength was evaluated by the crack opening method and was 1.3 J/m$^2$.

Example C6

In Example C1, the material of the bonding layer 3 was niobium pentoxide ($Nb_2O_5$) and the film-formation of the bonding layer 3 was performed by a sputtering method. The other procedures were the same as those in Example C1 to produce the bonded body.

As a result, the separation of the bonded parts was not observed during the grinding and polishing steps of the piezoelectric material substrate. Further, the bonding strength was evaluated by the crack opening method and was 2.0 J/m$^2$.

Example C7

In Example C1, the material of the bonding layer 3 was titanium oxide ($TiO_2$) and the film-formation of the bonding layer 3 was performed by a sputtering method. The other procedures were the same as those in Example C1 to produce the bonded body.

As a result, the separation of the bonded parts was not observed during the grinding and polishing steps of the piezoelectric material substrate. Further, the bonding strength was evaluated by the crack opening method and was 1.8 J/m$^2$.

Comparative Example C1

In Example C1, the bonding layer 4A was not formed. The other procedures were the same as those in Example C1 to produce the bonded body.

As a result, the separation of the bonded parts was observed during the grinding and polishing steps of the piezoelectric material substrate. Further, the bonding strength was evaluated by the crack opening method and was 0.1 J/m$^2$.

Comparative Example C2

The tantalum pentoxide layer was provided as the bonding layer 4 as in Example C3. Then, the surface of the bonding layer and the surface of the piezoelectric material substrate were subjected to surface activation by a plasma activation method. The other procedures were the same as those in Example C4 to produce the bonded body. The inside of a chamber was evacuated to an order of $10^{-1}$ Pa, an $N_2$ plasma (power of 200 W) was irradiated onto the surface of a wafer for 60 seconds, the wafer was then taken out into the air and washed by pure water. The bonding was further performed in the air and a load of 2000N was applied for 2 minutes.

As a result, the separation of the bonded parts was observed during the grinding and polishing steps of the piezoelectric material substrate. Further, the bonding strength was evaluated by the crack opening method and was 0.3 J/m$^2$.

Example D1

A bonded body was produced, according to the method of the third invention, described referring to FIGS. 8 and 9.

Specifically, a substrate (LT substrate) of lithium tantalate having an orientation flat (OF) part, a diameter of 4 inches and thickness of 250 μm was used as the piezoelectric single crystal substrate 1. The surface 1a of the piezoelectric material substrate 1 and surface 6a of the supporting body 6 were mirror-polished to an arithmetic average roughness Ra of 1 nm. The silicon oxide film 2 was then formed of 1.0 μm on the surface 1a of the piezoelectric material substrate 1 by a sputtering method. The arithmetic average roughness Ra after the film-formation was 2 nm. Then, the bonding layer made of mullite was formed on the silicon oxide film 2 in 1.0 µm by a CVD method. The Ra after the film-formation was 2.0 nm. The bonding layer 3 was then subjected to chemical mechanical polishing (CMP) so that the film thickness was 0.5 µm and Ra was 0.3 nm.

Further, as the supporting body 6, a silicon substrate having an OF part, a diameter of 4 inches and a thickness of 230 µm was prepared. As the LT substrate, a 46° Y-cut X-propagation LT substrate, in which the direction of propagation of the surface acoustic wave (SAW) is X and the Y-cut plate is rotated in a cutting angle was used. The silicon oxide film 2 was then formed of 1.0 µm on the surface of the supporting body 6 by a sputtering method. The arithmetic average roughness Ra after the film-formation was 2 nm. Then, the bonding layer made of silicon having a high resistivity was formed on the silicon oxide film 2 of 1.0 µm by a CVD method. The Ra after the film-formation was 2.0 nm. The bonding layer was then subjected to chemical mechanical polishing (CMP) so that the film thickness was 0.5 µm and Ra was 0.3 nm.

Then, the flat surface of the first bonding layer 4A on the piezoelectric material substrate 1 and the flat surface of the second bonding layer 4B on the supporting body 6 were cleaned to remove contamination, followed by introduction into a vacuum chamber. The chamber was evacuated to an order of $10^{-6}$ Pa and a high-speed atomic beam (acceleration voltage of 1 kV and Ar flow rate of 27 sccm) was irradiated onto the bonding surfaces of the respective substrates for 120 sec. Then, the activated surface 5A of the first bonding layer on the piezoelectric material substrate and the activated surface 5B of the second bonding layer on the supporting body were contacted with each other, followed by pressurizing at 10000N for 2 minutes to bond the respective substrates (refer to FIG. 9(a)).

Then, the surface 1b of the piezoelectric single crystal substrate 1 was ground and polished until the thickness was changed from the initial thickness of 250 µm to 3 µm (refer to FIG. 9(b)). The separation of the bonded parts was not observed during the grinding and polishing steps. Further, the bonding strength was evaluated by the crack opening method and was 1.5 J/m².

Example D2

In Example D1, the materials of the first and second bonding layers were alumina and the film-formation of the bonding layers was performed by a sputtering method. The other procedures were the same as those in Example D1 to produce the bonded body.

As a result, the separation of the bonded parts was not observed during the grinding and polishing steps of the piezoelectric material substrate. Further, the bonding strength was evaluated by the crack opening method and was 1.4 J/m².

Example D3

In Example D1, the materials of the first and second bonding layers were tantalum pentoxide ($Ta_2O_5$) and the film-formation of the bonding layers was performed by a sputtering method. The other procedures were the same as those in Example D1 to produce the bonded body.

As a result, the separation of the bonded parts was not observed during the grinding and polishing steps of the piezoelectric material substrate. Further, the bonding strength was evaluated by the crack opening method and was 1.5 J/m².

Example D4

In Example D1, the materials of the first and second bonding layers were silicon nitride ($Si_3N_4$) and the film-formation of the bonding layers was performed by a sputtering method. The other procedures were the same as those in Example D1 to produce the bonded body.

As a result, the separation of the bonded parts was not observed during the grinding and polishing steps of the piezoelectric material substrate. Further, the bonding strength was evaluated by the crack opening method and was 1.4 J/m².

Example D5

In Example D1, the materials of the first and second bonding layers were aluminum nitride (AlN) and the film-formation of the bonding layers was performed by a sputtering method. The other procedures were the same as those in Example D1 to produce the bonded body.

As a result, the separation of the bonded parts was not observed during the grinding and polishing steps of the piezoelectric material substrate. Further, the bonding strength was evaluated by the crack opening method and was 1.3 J/m².

Example D6

In Example D1, the materials of the first and second bonding layers were niobium pentoxide ($Nb_2O_5$) and the film-formation of the bonding layers was performed by a sputtering method. The other procedures were the same as those in Example D1 to produce the bonded body.

As a result, the separation of the bonded parts was not observed during the grinding and polishing steps of the piezoelectric material substrate. Further, the bonding strength was evaluated by the crack opening method and was 2.0 J/m².

Example D7

In Example D1, the materials of the first and second bonding layers were titanium oxide ($TiO_2$) and the film-formation of the bonding layers was performed by a sputtering method. The other procedures were same as those in Example D1 to produce the bonded body.

As a result, the separation of the bonded parts was not observed during the grinding and polishing steps of the piezoelectric material substrate. Further, the bonding strength was evaluated by the crack opening method and was 1.8 J/m².

Comparative Example D1

In Example D1, the first bonding layer was not formed. The other procedures were the same as those in Example D1 to produce the bonded body.

As a result, the separation of the bonded parts was observed during the grinding and polishing steps of the piezoelectric material substrate. Further, the bonding strength was evaluated by the crack opening method and was 0.1 J/m².

Comparative Example D2

The tantalum pentoxide layers were provided as the first and second bonding layers as in Example D3. Then, the surface of the bonding layer and the surface of the supporting body were subjected to surface activation by a plasma activation method. The other procedures were the same as those in Example D4 to produce the bonded body. The inside of a chamber was evacuated to an order of $10^{-1}$ Pa, an $N_2$ plasma (power of 200 W) was irradiated onto the surface of a wafer for 60 seconds, the wafer was then taken out into the air and washed by pure water. The bonding was further performed in the air and a load of 2000N was applied for 2 minutes.

As a result, the separation of the bonded parts was observed during the grinding and polishing steps of the piezoelectric material substrate. Further, the bonding strength was evaluated by the crack opening method and was 0.3 J/m$^2$.

The invention claimed is:

1. A method of bonding a piezoelectric material substrate and a supporting body comprising a single crystal, said method comprising the steps of:
    providing a film consisting of silicon oxide on said piezoelectric material substrate;
    forming a bonding layer on said silicon oxide film, said bonding layer consisting of one or more materials selected from the group consisting of aluminum nitride, alumina, tantalum pentoxide, mullite, niobium pentoxide and titanium oxide;
    flattening a surface of said bonding layer by polishing said surface of said bonding layer to a surface roughness Ra of 1 nm or lower;
    emitting a neutralized atomic beam from a high speed atomic beam source, wherein said neutralized atomic beam is generated from an ion beam composed of atoms of an inert gas that is neutralized at a grid within said high speed atomic source; and
    irradiating said neutralized atomic beam onto said surface of said bonding layer and a surface of said supporting body to activate said surface of said bonding layer and said surface of said supporting body; and
    bonding said surface of said bonding layer and said surface of said supporting body by direct bonding.

2. The method of claim 1, further comprising a step of processing said piezoelectric material substrate to form a roughened surface, wherein said silicon oxide film and said bonding layer are provided on said roughened surface.

3. The method of claim 1, wherein said surface of said bonding layer is activated after said surface of said bonding layer is flattened.

4. The method of claim 1, wherein said supporting body comprises a material selected from the group consisting of silicon, sapphire and quartz.

5. The method of claim 1, wherein said piezoelectric material substrate comprises a piezoelectric single crystal.

6. The method of claim 5, wherein said piezoelectric single crystal comprises lithium niobate, lithium tantalate or lithium niobate-lithium tantalate solid solution.

* * * * *